(12) United States Patent
Iwanaka et al.

(10) Patent No.: US 12,385,861 B2
(45) Date of Patent: Aug. 12, 2025

(54) CHARGED PARTICLE DETECTOR, CHARGED PARTICLE RAY DEVICE, RADIATION DETECTOR, AND RADIATION DETECTION DEVICE

(71) Applicant: Hitachi High-Tech Corporation, Tokyo (JP)

(72) Inventors: Takumu Iwanaka, Tokyo (JP); Yoshifumi Sekiguchi, Tokyo (JP); Toshiaki Kusunoki, Tokyo (JP); Shin Imamura, Tokyo (JP); Hajime Kawano, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 462 days.

(21) Appl. No.: 17/791,933

(22) PCT Filed: Mar. 2, 2020

(86) PCT No.: PCT/JP2020/008668
§ 371 (c)(1),
(2) Date: Jul. 11, 2022

(87) PCT Pub. No.: WO2021/176513
PCT Pub. Date: Sep. 10, 2021

(65) Prior Publication Data
US 2023/0050424 A1 Feb. 16, 2023

(51) Int. Cl.
*G01N 23/2251* (2018.01)
*G01T 1/20* (2006.01)

(52) U.S. Cl.
CPC ....... *G01N 23/2251* (2013.01); *G01T 1/2002* (2013.01); *G01N 2223/07* (2013.01); *G01N 2223/40* (2013.01); *G01N 2223/505* (2013.01)

(58) Field of Classification Search
CPC ........... G01N 23/2251; G01N 2223/07; G01N 2223/40; G01N 2223/505; G01T 1/2002;
(Continued)

(56) References Cited

U.S. PATENT DOCUMENTS

| 7,504,622 B2 | 3/2009 | Elyasaf et al. |
| 8,164,059 B2 * | 4/2012 | Gerlach ................ H01J 37/244 250/397 |

(Continued)

FOREIGN PATENT DOCUMENTS

| JP | 63-042491 A | 2/1988 |
| JP | 2012-500447 A | 1/2012 |

(Continued)

OTHER PUBLICATIONS

Taiwanese Office Action received in corresponding to Taiwanese Application No. 110106405 dated Nov. 17, 2021.
(Continued)

*Primary Examiner* — David A Vanore
(74) *Attorney, Agent, or Firm* — MATTINGLY & MALUR, PC

(57) ABSTRACT

Provided are a charged particle detector and a radiation detector capable of obtaining an observation image with correct contrast without saturation even when the number of signal electrons incident on a detector is increased due to an increase in the current of a primary electron beam. The charged particle detector is characterized by having a scintillator (109) having a signal electron detection surface (109*a*) for detecting signal electrons emitted when a specimen is irradiated with primary electrons and converting the signal electrons into light, a light detector (111) having a light detection surface (111*a*) for detecting the light emitted from the scintillator (109), and a light guide (110) disposed between the scintillator (109) and the light detector (111), (Continued)

wherein the area of the light detection surface (111a) is larger than the area of the signal electron detection surface (109a).

16 Claims, 12 Drawing Sheets

(58) Field of Classification Search
CPC ..... H01J 2237/2443; H01J 2237/24465; H01J 37/244
See application file for complete search history.

(56) References Cited

U.S. PATENT DOCUMENTS

| | | | |
|---|---|---|---|
| 8,829,451 B2* | 9/2014 | Wang | H01J 37/244 250/368 |
| 8,895,935 B2 | 11/2014 | Wang et al. | |
| 11,694,873 B2* | 7/2023 | Sekiguchi | H01J 37/244 250/311 |
| 2008/0061244 A1 | 3/2008 | Adamec et al. | |
| 2008/0315094 A1 | 12/2008 | Wang et al. | |
| 2009/0090866 A1* | 4/2009 | Zhang | H01J 37/244 250/311 |
| 2011/0139984 A1 | 6/2011 | Kurata et al. | |
| 2013/0234032 A1* | 9/2013 | Wang | H01J 37/28 250/368 |
| 2013/0334430 A1* | 12/2013 | Wang | G01T 1/2002 250/368 |
| 2016/0054456 A1 | 2/2016 | Lebrun et al. | |
| 2017/0323761 A1* | 11/2017 | Luo | H01J 37/28 |
| 2018/0261425 A1 | 9/2018 | Shirasaki et al. | |
| 2021/0183614 A1* | 6/2021 | Sekiguchi | G02B 6/4214 |
| 2023/0030651 A1* | 2/2023 | Sekiguchi | G01N 23/2251 |
| 2023/0050424 A1* | 2/2023 | Iwanaka | H01J 37/244 |
| 2023/0266485 A1* | 8/2023 | Sari | G01T 1/20188 250/361 R |

FOREIGN PATENT DOCUMENTS

| | | |
|---|---|---|
| JP | 2016-514835 A | 5/2016 |
| JP | 2018-152232 A | 9/2018 |
| TW | I455169 B | 10/2014 |

OTHER PUBLICATIONS

Decision of Refusal received in corresponding to Taiwanese Application No. 110106405 dated Jan. 27, 2022.
International Search Report of PCT/JP2020/008668 dated Jun. 2, 2020.

* cited by examiner (a)

(b)

CHARGED PARTICLE DETECTOR, CHARGED PARTICLE RAY DEVICE, RADIATION DETECTOR, AND RADIATION DETECTION DEVICE

TECHNICAL FIELD

The present invention relates to a charged particle detector, a charged particle ray device, a radiation detector, and a radiation detection device.

BACKGROUND ART

Detectors are used to convert particle signals such as electrons and ions and radiation signals such as X-rays and gamma rays into voltage, current signals, and the like. When the detection target is a charged particle, it is called a charged particle detector, and when the detection target is a radiation, it is called a radiation detector. For example, in a charged particle device using a charged particle ray such as an electron beam of a scanning electron microscope (SEM), and the like, a signal to be detected is a charged particle such as an electron, and a charged particle detector is essential. In the SEM, a specimen to be observed is irradiated with an electron beam generated by an electron source, whereby electrons emitted from the specimen are detected by the charged particle detector. The charged particle detector outputs a current according to the amount of detected electrons. An SEM image is formed by two-dimensionally displaying the relationship between the current amount and the electron beam irradiation position on the specimen.

Many of such charged particle detectors are configured by a scintillator that converts the detected electrons into photons, a photodetector that detects the photons from the scintillator and converts the photons into current, and a light guide that delivers light emitted by the scintillator to the photodetector. As the photodetector, a photomultiplier tube (PMT), a multi-pixel photon counter (MPPC), or the like is used. In the radiation detector, only the type of scintillator is different in a similar configuration. That is, the radiation detector uses a scintillator that converts the detected radiation into light having a wavelength detectable by the photodetector, and is configured to deliver light from the scintillator to the photodetector via the light guide.

In order to acquire more signals, it is required to arrange a detector in the vicinity of the specimen. For example, in the SEM, it is conceivable to arrange a detector between a specimen and an objective or a final lens. PTL 1 proposes such a detector.

CITATION LIST

Patent Literature

PTL 1: JP 2018-152232 A

SUMMARY OF INVENTION

Technical Problem

In the SEM, when the current of the primary electron beam is increased, the number of electrons exited from the specimen and detected increases, the S/N of the image improves, the noise of the image becomes inconspicuous, and the resolution enhances, and hence there is a demand for increasing the current of the primary electron beam. At this time, the number of photons converted from electrons to photons by the scintillator and enters the photodetector also increases. However, when the incident photon density with respect to the area of the detection surface increases, the photodetector saturates and cannot accurately count the number of incident photons. In particular, in MPPC (e.g., manufactured by Hamamatsu Photonics K.K., model: S13360-6025C5), fine quadrangular detection pixels having a side of about several tens of µm are spread on a quadrangular detection surface having a side of about several mm, and when a photon enters each detection pixel, an electric signal is generated for each pixel, where the electric signal of each pixel represents one detection of the photon. However, when the incident photon density increases and a plurality of photons simultaneously enter the detection pixel, the proportional relationship between the number of incident photons and the output current collapses, and an accurate photographed image cannot be obtained. That is, there is a problem that the photodetector saturates when the current of the primary electron beam increases.

PTL 1 described above does not describe an increase in current of a primary electron beam, and does not describe a problem related to saturation. The problem that the signal saturates is not limited to the charged particle detector, and the same applies to the radiation detector.

In view of the above circumstances, an object of the present invention is to provide a charged particle detector and a radiation detector capable of obtaining an observation image with correct contrast without saturating even when the number of signal electrons entering the detector is increased due to an increase in the current of the primary electron beam.

Solution to Problem

In order to achieve the above object, one aspect of the present invention provides a detector including a scintillator, a light guide, and a photodetector, in which an area of a detection surface of the photodetector is larger than an area of a detection surface of the scintillator.

A more specific configuration of the present invention is described in the claims.

Advantageous Effects of Invention

In view of the above circumstances, it is possible to provide a charged particle detector and a radiation detector capable of obtaining an observation image with correct contrast without saturating even when the number of signal electrons entering the detector is increased due to an increase in the current of the primary electron beam.

Problems, configurations, and effects other than those described above will be made apparent by the description of the following embodiments.

DESCRIPTION OF EMBODIMENTS

Figure 1:
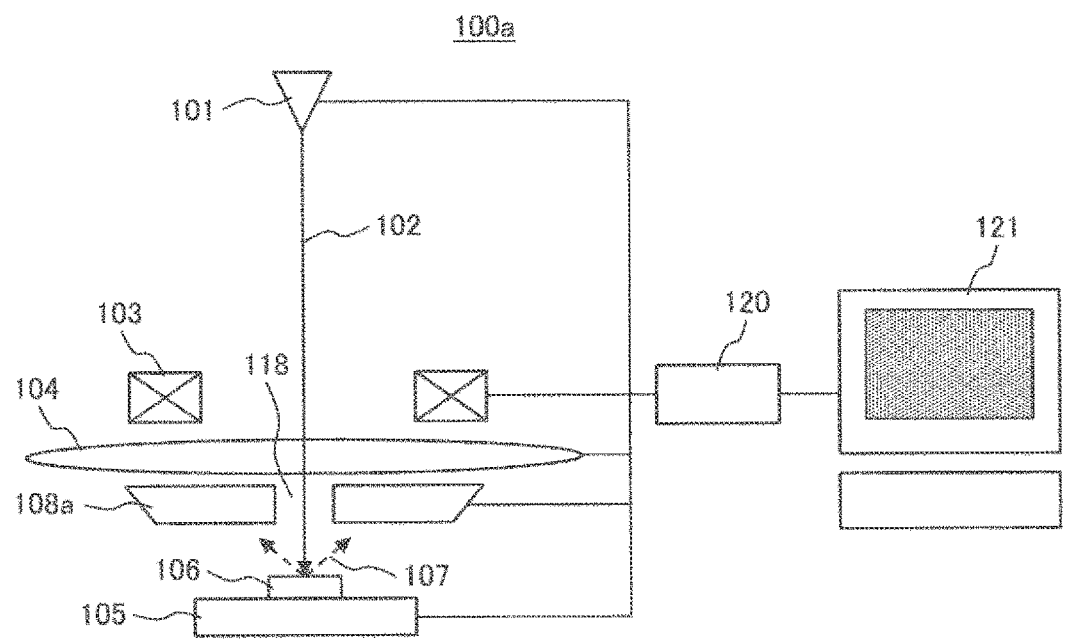
FIG. 1 is a schematic diagram of a charged particle ray device (SEM) according to a first example.

Hereinafter, examples of the present invention will be described in detail with reference to the drawings. In all the drawings for describing the examples, the same elements are denoted by the same reference numerals, and repeated description thereof will be omitted. Hereinafter, an example in the detection of the electron beam will be described, but the effect of the present invention is not lost even when ion beam or radiation is used.

First Example

FIG. 1 is a schematic diagram of a charged particle ray device (SEM) according to a first example. As illustrated in FIG. 1, a charged particle ray device 100a includes a scanning deflector 103 and an objective lens 104 arranged on a trajectory of primary electrons 102 extracted from an electron source 101. A specimen 106 arranged on a specimen transport stage 105 is irradiated with the primary electrons 102, and a signal electron 107 is exited from the specimen 106. Here, the signal electron 107 refers to an electron exited from the specimen, such as a secondary electron directly excited by the primary electrons and emitted into vacuum, or a reflected electron obtained in a state that the primary electrons are repeatedly scattered in the specimen and emitted into the vacuum again.

A charged particle detector 108 that detects signal electrons is provided below the objective lens 104, and an opening 118 is provided at the center thereof to allow the primary electrons 102 to pass therethrough. The primary electrons 102 emitted from the electron source 101 are controlled by the objective lens 104 and focused on the specimen 106 so that the beam diameter is minimized. The scanning deflector 103 is controlled by a system control unit 120 so that the primary electrons 102 scan a defined region of the specimen 106. The signal electrons 107 generated from the position where the primary electrons 102 have reached on the specimen 106 are detected by the charged particle detector 108. In synchronization with a scanning signal sent from the system control unit 120 to the scanning deflector 103, signal processing of the detected signal electrons 107 is performed, whereby an SEM image is formed on a monitor 121.

Figure 2:
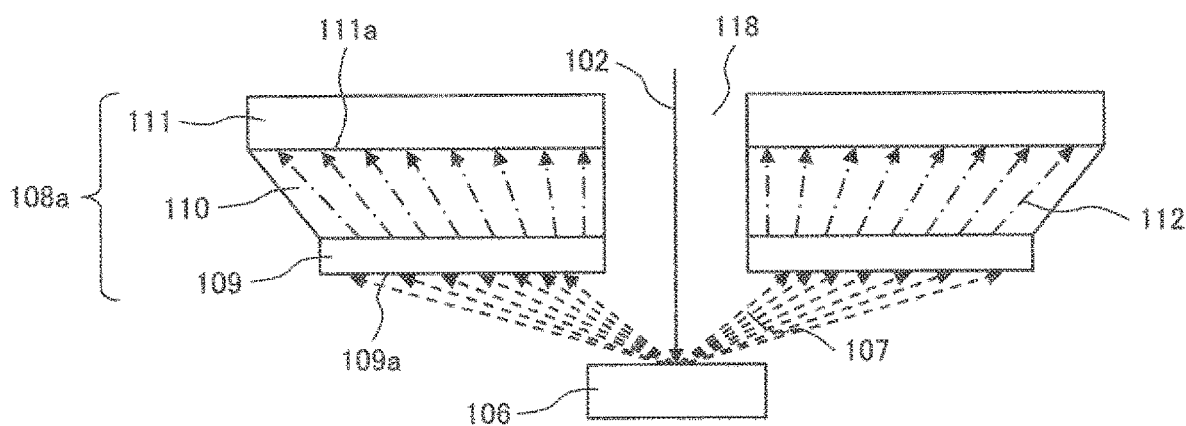
FIG. 2 is a schematic diagram of the charged particle detector of FIG. 1.

FIG. 2 is a schematic diagram of the charged particle detector of FIG. 1. The charged particle detector of the present example includes a scintillator 109 that converts the incident signal electron 107 into light 112, a light guide 110 that is provided in contact with the scintillator and guides the light 112 to the photodetector, and a photodetector 111 that is provided immediately above the light guide and detects the guided light. Then, an area of a detection surface 111a of the photodetector is larger than an area of a detection surface 109a of the scintillator, and an optical path is expanded by the light guide 110. The signal electrons 107 exit from the specimen 106 enter the scintillator 109, but there is a bias in the incident position, and a large number of signal electrons enter a position close to the trajectory of the primary electrons 102, that is, a position several mm from the opening 118. On the other hand, in the photodetector, when the incident photon density with respect to the area of the detection surface increases, the proportional relationship between the incident photon amount and the output current collapses, the number of incident photons cannot be accurately counted, and an accurate photographed image cannot be obtained. When the current of the primary electron beam is increased, in particular, the number of photons entering from the detection surface 111a close to the opening 118 increases, and the signal intensity corresponding to the primary electrons 102 entering near the opening 118 saturates.

The charged particle detector 130 of the present example has a structure in which the optical path is expanded by the light guide, and thus has an effect that the photons obtained by converting signal electrons that have entered the scintillator at high density are dispersed, the density of the photons entering the photodetector is reduced, the photodetector does not saturate even when the current of the primary electron beam is increased and a photographed image with correct contrast can be obtained.

In addition, in order to allow as many signal electrons 107 as possible to enter, it is desirable to make the opening 118 as small as possible within a range not interfering with the trajectory of the primary electrons 102. Therefore, with respect to the detection surface 109a of the scintillator, the detection surface 111a of the photodetector is expanded toward the outer side without being expanded toward the opening 118 side. In the charged particle detector of the present example, the opening 118 is made as small as possible within a range not interfering with the trajectory of the primary electrons, and the detection surface of the photodetector is expanded toward the outer side with respect to the detection surface of the scintillator, so that an effect that a large amount of signal electrons 107 can be detected is obtained.

Furthermore, the inventor has found that the transmittance of the light guide (the ratio of the light exiting from the other surface with respect to the light entering from the one surface) becomes higher when the light is propagated from the side having the smaller area to the side having the larger area. Therefore, when the area of the exit surface is increased with respect to the incident surface as in the present configuration, not only is the light dispersed but the transmittance is also increased.

Note that the effect of the present invention can be obtained as long as the area of the light detection surface 111a is larger than the area of the signal electron detection surface 109a, and thus the shape of the light guide 110 is not limited. The light guide 110 of FIG. 2 has a shape in which the transverse section of the light guide 110 increases from the signal electron detection surface 109a toward the light detection surface 111a, but for example, may have a shape in which the transverse section decreases from the signal electron detection surface 109a and increases from a certain location toward the signal electron detection surface 109a.

Second Example

Figure 3A:
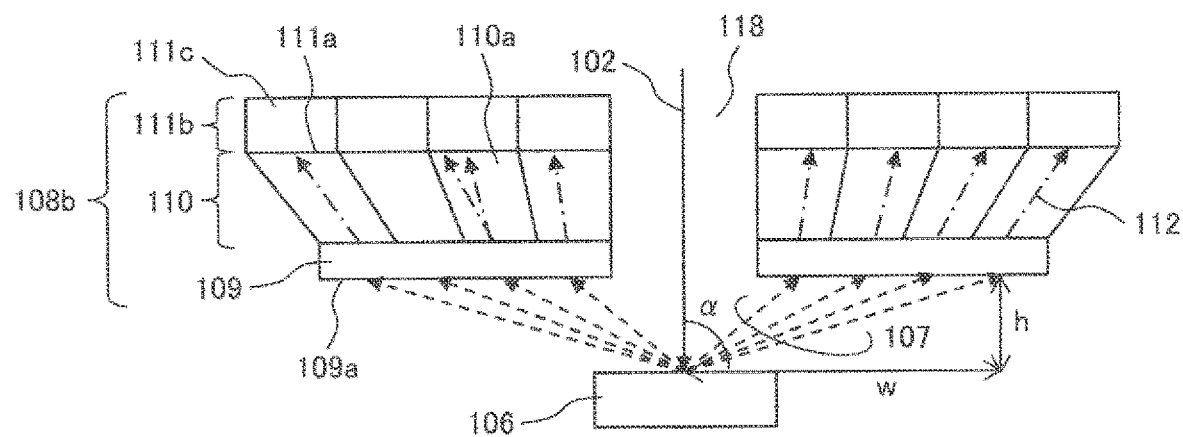
FIG. 3A is a schematic diagram of the charged particle detector according to a second example.
Figure 3B:
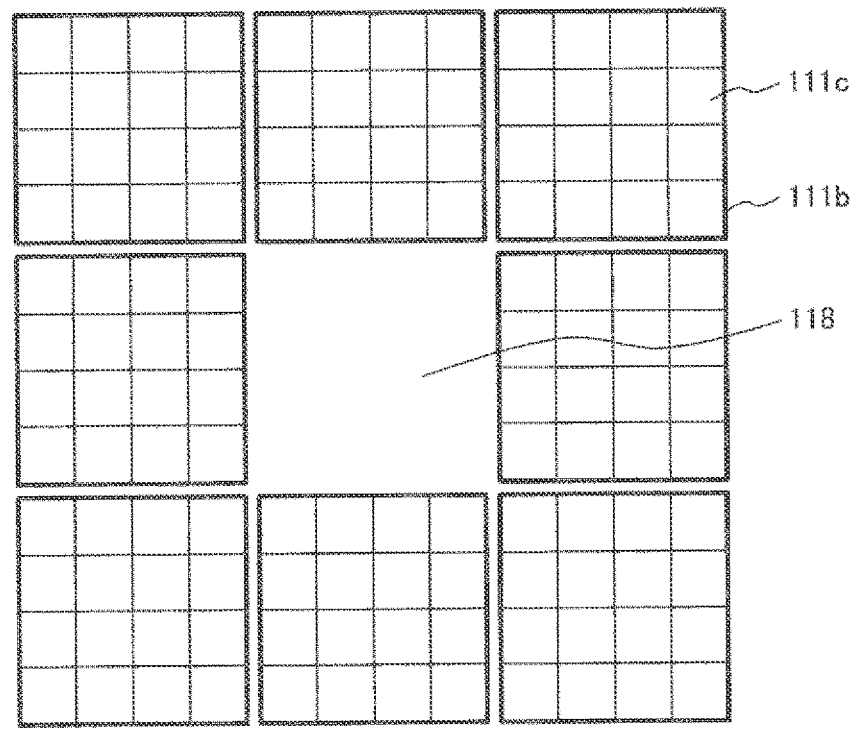
FIG. 3B is a schematic view of a detection surface of a photodetector viewed from a specimen direction of the charged particle detector in FIG. 3A.

FIG. 3A is a schematic diagram of a charged particle detector according to a second example, and FIG. 3B is a schematic view of a detection surface of a photodetector viewed from a specimen direction of the charged particle detector of FIG. 3A. In a charged particle detector 108b of the present example, the photodetector 111 of the first example is an array-shaped photodetector 111b including a plurality of detection cells 111c, and the light guide 110 includes a plurality of divided blocks 110a. As illustrated in FIG. 3B, in the present example, as an example, eight array-shaped photodetectors 111b (e.g., manufactured by Hamamatsu Photonics K.K., model: S13615-1025N-04) including detection cells 111c of 16 (4×4) channels are arranged to form a photodetector. In addition, eight array-shaped photodetectors (e.g., manufactured by Hamamatsu Photonics K.K., model: S13615-1025N-08) including detection cells of 64 (8×8) channels can be arranged.

The divided blocks 110a of the light guide correspond to the detection cells 111c of the array-shaped photodetector on a one-to-one basis, and the photon entering the divided block 110a of one light guide cannot enter another adjacent block (strictly speaking, the photons slightly enter another adjacent block). With this structure, the signal electrons 107 that have entered the detection surface 109a of the scintillator are converted into photons, the photons enter the divided block 110a of the light guide immediately above the incident position of the scintillator, and the light is guided in the divided block 110a of the light guide to enter the detection cell 111c of the array-shaped photodetector 111b corresponding to the relevant divided block 110a.

Assuming that the distance from the incident position of the primary electrons 102 on the specimen 106 to the incident position of the signal electrons 107 on the detection surface 109a of the scintillator is w, the distance from the surface of the specimen 106 to the detection surface 109a of the scintillator is h, and the exit angle of the signal electrons 107 from the specimen is α, when the photodetector 111b detects the signal electrons 107, w can be measured from the position of the detection cell 111c. Furthermore, since h is a known value, the exit angle α of the signal electron from the specimen can be calculated from w and h. Since the direction in which the signal electrons are emitted varies depending on the material and shape of the specimen, information on the material and shape of the specimen can be obtained by detecting the exit angle of the signal electrons from the specimen. The detector capable of detecting the incident position of the signal electron in this manner is referred to as a position discrimination detector in the present specification. With the configuration described above, the charged particle detector of the present example has a structure in which the incident position of the signal electron on the detection surface can be discriminated with satisfactory accuracy and the exit angle of the signal electron from the specimen can be calculated, and has an effect in that information on the material and shape of the specimen can be obtained.

Third Example

FIG. 4 is a schematic diagram of a charged particle detector according to a third example. Since the signal electrons enter the scintillator to be converted into light, but the light propagates inside the scintillator, in the charged particle detector of the second example, photons converted from the signal electrons may move inside the scintillator, and may not enter the divided block 110a of the light guide immediately above the incident position of the signal electrons on the scintillator but may enter the divided block of another adjacent light guide. As in this phenomenon, a phenomenon in which the position where the signal electron entered does not correspond to the position of the photodetector that receives the photon is referred to as crosstalk in the present specification. The correspondence relationship between the incident position of the signal electron on the scintillator and the position of the detection cell of the photodetector collapses due to the crosstalk (the above-described w cannot be accurately measured), and the exit angle α of the signal electron from the specimen cannot be accurately calculated from the position of the detection cell of the photodetector when the signal electrons have entered, and the accuracy of the incident position discrimination lowers.

Figure 4A:
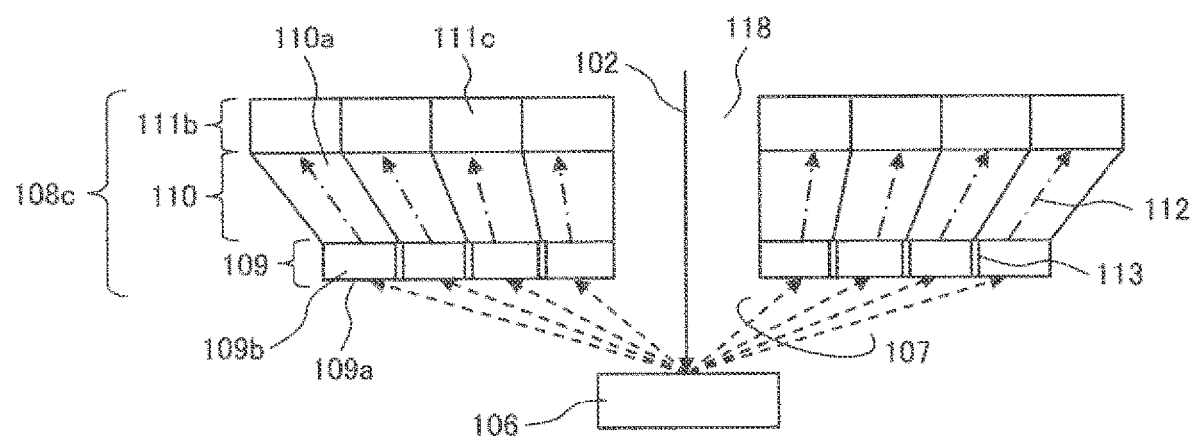
FIG. 4A is a schematic diagram of the charged particle detector according to a third example.
Figure 4B:
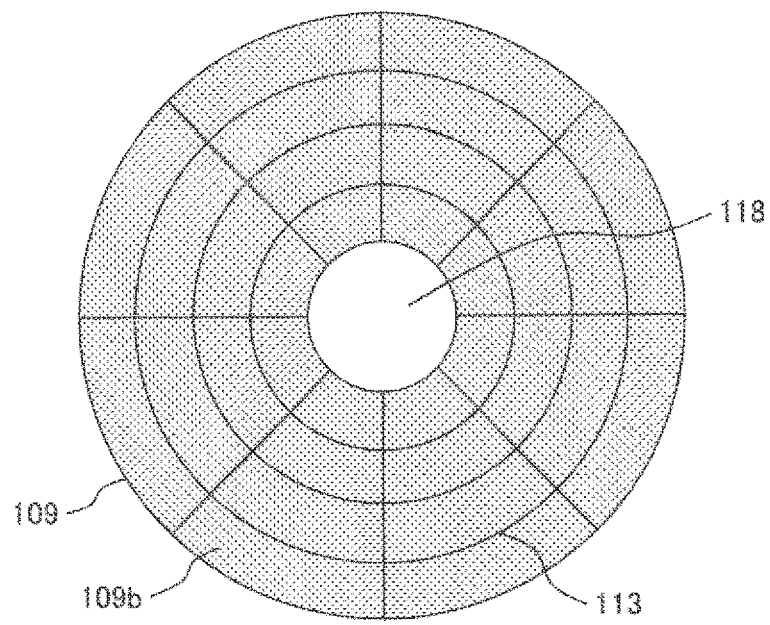
FIG. 4B is a schematic view showing an example of a detection surface of a photodetector viewed from a specimen direction of the charged particle detector in FIG. 4A.
Figure 4C:
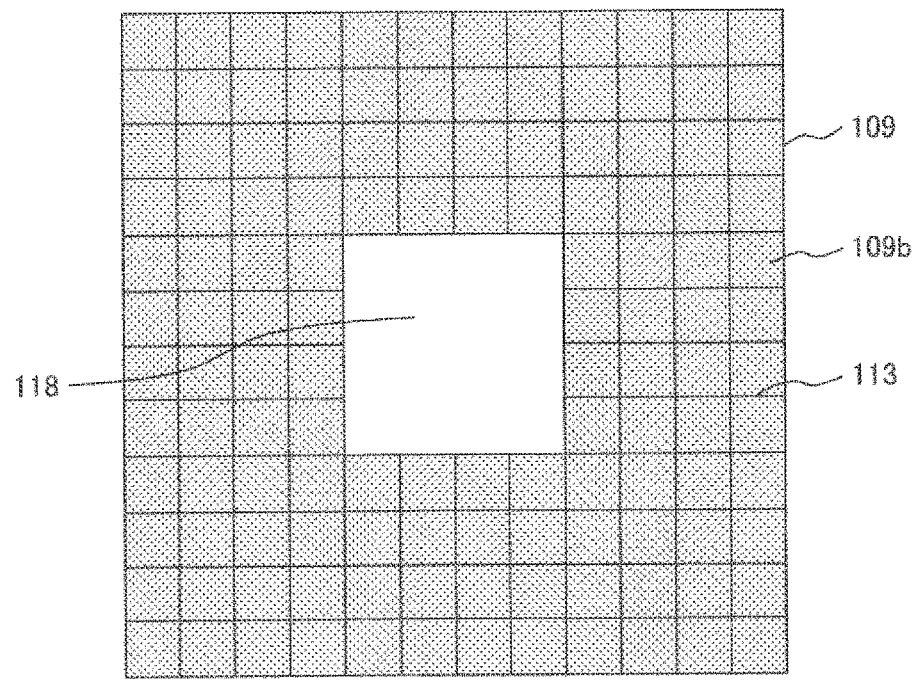
FIG. 4C is a schematic view showing another example of a detection surface of a photodetector viewed from a specimen direction of the charged particle detector of the third example.

FIG. 4B is a schematic view of one example of a detection surface of the photodetector viewed from a specimen direction of the charged particle detector of FIG. 4A, and FIG. 4C is a schematic view of another example of a detection surface of the photodetector viewed from a specimen direction of the charged particle detector of the third example. In the charged particle detector of the present example, in addition to the structure of the second example, the scintillator 109 is divided into divided cells 109b of a plurality of scintillators by a dividing unit 113. Here, division means a structure that reduces propagation of light, for example, a structure in which a notch is provided in the dividing unit of the scintillator, the dividing unit is completely cut, or a partition is provided thereat.

An opening 118 for emitting primary electrons is provided at the center of the scintillator 109. The divided cells 109b of the scintillator, the divided blocks 110a of the light guide, and the detection cells 111c of the photodetector correspond on a one-to-one basis, and photons do not enter adjacent divided cells or divided blocks while moving from the scintillator to the light guide and from the light guide to the photodetector. The scintillator 109 has an annular shape in FIG. 4B and a quadrangular shape in FIG. 4C. As described above, the shapes of the scintillator, the light guide, and the photodetector are not limited as long as the divided cells of the scintillator, the divided blocks of the light guide, and the divided cells of the photodetector correspond on a one-to-one basis.

In a case where the array structures of the scintillator 109 and the photodetector are different, the light guide compensates for the difference in the array structure to have a one-to-one correspondence. As the scintillator is divided, the movement of photons from the divided cell of the scintillator to which the signal electrons entered to the adjacent divided cell can be reduced, and crosstalk can be reduced, so that when the signal electrons enter, the exit angle α of the signal electrons from the specimen can be calculated more accurately from the position of the detection cell of the photodetector. The charged particle detector according to the present embodiment has an effect that crosstalk can be reduced and accuracy of incident position discrimination of signal electrons can be improved by dividing the scintillator.

In addition, by forming a reflection layer in the dividing unit 113 of the scintillator, signal electrons enter a divided cell of a certain scintillator and are converted into photons, and jump out from a side surface of the incident divided cell to enter an adjacent divided cell thus preventing crosstalk from occurring, and the exit angle α of the signal electrons from the specimen can be calculated more accurately from the position of the detection cell of the photodetector.

As the material of the reflection layer, a material having a high light reflectance is preferably used, and specifically, aluminum (Al) is desirable. Examples of a method of forming the reflection layer include a method of forming a thin film made of a material constituting the reflection layer on the surface of the dividing unit 113 by sputtering, vapor deposition, or the like, a method of sticking a metal plate made of a material constituting the reflection layer, and a method of applying a resin mixed with particles having high reflectance. The charged particle detector according to the present embodiment has an effect that crosstalk can be reduced and accuracy of incident position discrimination of signal electrons can be improved by forming the reflection layer on the dividing unit 113 of the scintillator.

Figure 4D:
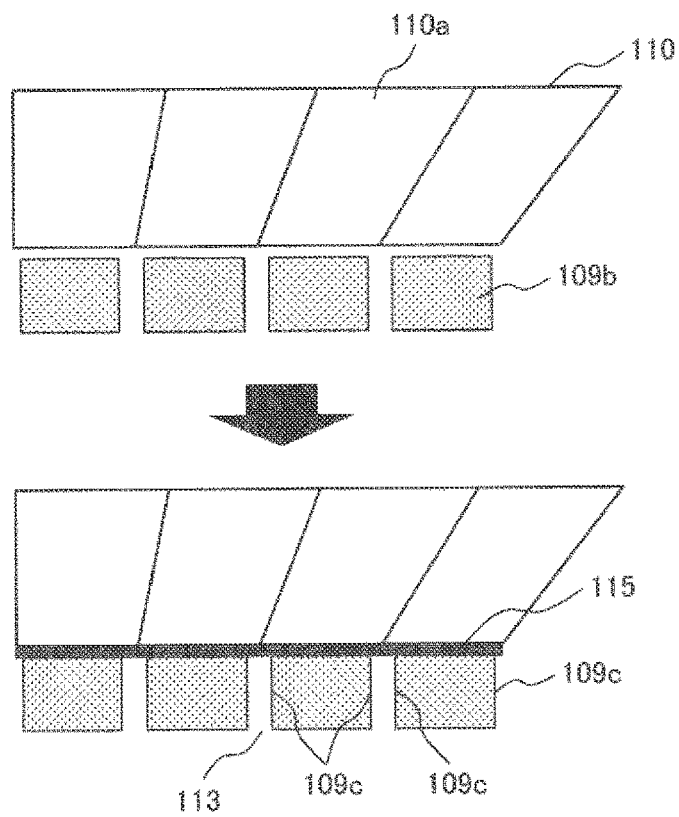
FIG. 4D is a schematic view for explaining a first example of a divided structure of the scintillator and a method for manufacturing the same.

A divided structure of the scintillator and a method for manufacturing the same will be described. FIG. 4D is a schematic view for explaining a first example of a divided structure of the scintillator and a method for manufacturing the same. In the structure of FIG. 4D, the divided cells 109b of the scintillator are molded so as to coincide with the pitch of the divided blocks 110a of the light guide, and are adhered with an adhesive 115. When the reflection layer is formed, the crosstalk can be reduced by forming the reflection layer on the side surface 109c of the divided cell 109b of the scintillator.

Figure 4E:
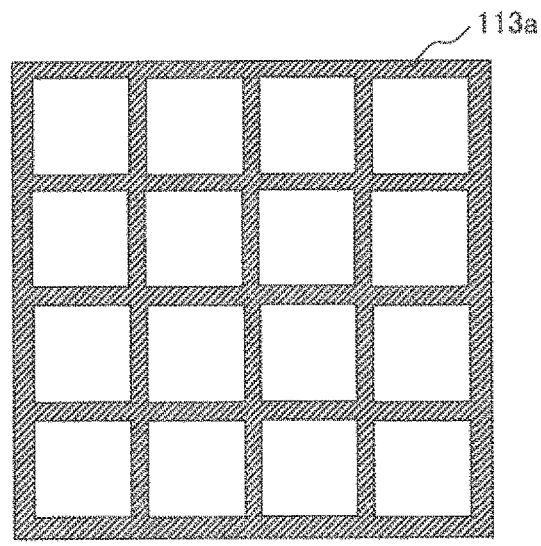
FIG. 4E is a schematic view showing a second example of the divided structure of the scintillator.
Figure 4F:
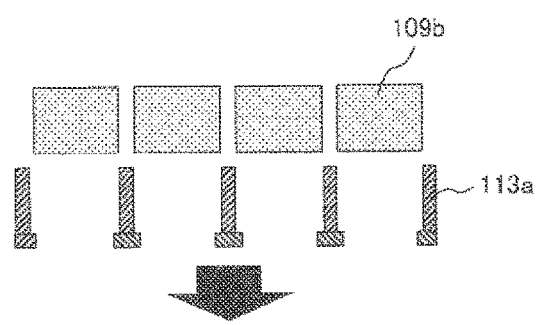
FIG. 4F is a schematic view for explaining a method for manufacturing the scintillator of FIG. 4E.
Figure 4F:
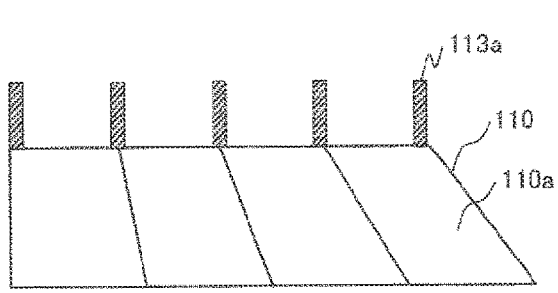
Figure 4F:
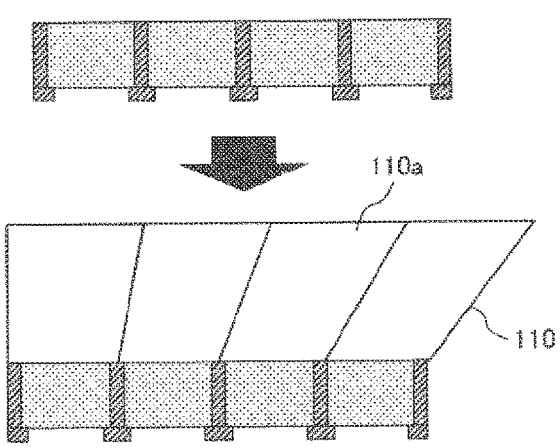

FIG. 4E is a second example of a divided structure of the scintillator, and FIG. 4F is a schematic view for explaining a method for manufacturing the scintillator of FIG. 4E. In the structure of FIG. 4E, a partition frame 113a is created to coincide with the pitch of the divided block of the light guide, and the divided cells 109b of the scintillator are formed in the partition frame 113a at a similar pitch. In the case of forming the reflection layer, the partition frame 113a is made of a material having high reflectance such as Al. In the method for manufacturing of FIG. 4F(a), the divided cells 109b of the scintillator molded at a similar pitch as that of the partition frame are fitted into and fixed to the partition frame 113a, and are arranged such that the pitch of the divided cells of the scintillator and the pitch of the divided blocks of the light guide coincide with each other. In the method for manufacturing of FIG. 4F(b), the partition frame 113a is fixed in advance so as to coincide with the pitch of the divided blocks of the light guide, and the divided cells 109b of the scintillator made of powder phosphor (e.g., P47 ($Y_2SiO_5$: Ce), YAG, GGAG (($(Y,Gd)_3(Al,Ga)_5O_{12}$: Ce, $(Y,Gd)_3(Al,Ga)_5O_{12}$: Tb), YAP ($YAlO_3$: Ce), GOS($Gd_2O_2S$: Pr,$Gd_2O_2S$: Ce, $Gd_2O_2S$: Tb)) are formed in the partition frame 113a. As a method of forming the powder phosphor, a sedimentation applying method or a printing method can be considered.

In the structure of FIG. 4E, since the divided cells 109b of the scintillator are integrated by the partition frame 113a, the scintillator can be easily fixed without adhering to the light guide. The charged particle detector of the present example has a structure in which the divided cells of the scintillator are integrated and fixed by the partition frame without using an adhesive, so that the manufacturing process can be simplified and the manufacturing cost can be reduced, and there is no risk that the inside of the vacuum chamber in which the scintillator is disposed is contaminated by gas from the adhesive.

Figure 4G:
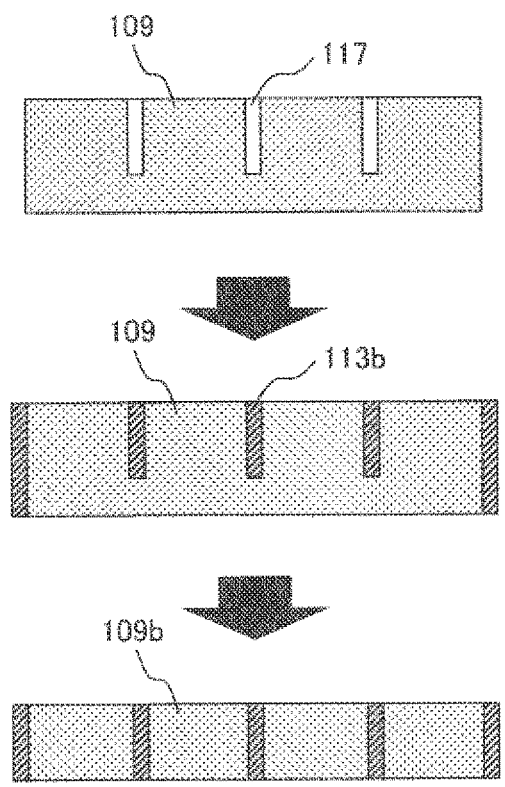
FIG. 4G is a schematic view showing a third example of the divided structure of the scintillator.

FIG. 4G is a schematic view showing a third example of the divided structure of the scintillator. In the structure of FIG. 4G, first, grooves 117 are provided in the scintillator 109 so as to coincide with the pitch of the divided blocks of the light guide, a material (resin etc.) having an adhesive force is impregnated into the grooves to form the partition 113b, and the lower portion of the scintillator 109 is removed until the partition 113b is reached thereby forming the divided cells 109b of the scintillator. In the case of forming the reflection layer, a resin or an adhesive obtained by mixing particles having high reflectance to a material to be the partition 113b is used.

In the method of FIG. 4G as well, since the divided cells 109b of the scintillator are integrated, the scintillator can be fixed without adhering to the light guide, similar to the method of FIG. 4F. The charged particle detector of the present example has the effect that the manufacturing process can be simplified and the manufacturing cost can be reduced by integrating and fixing the divided cells of the scintillator with resin or adhesive to be the partition between the divided cells of the scintillator.

In addition, since the pitch of one detection cell of the existing array-shaped photodetector is about 1 mm at the minimum, the resolution of position discrimination of the charged particle detector becomes about 1 mm at the maximum when the areas of the detection cell of the photodetector and the divided cell of the scintillator are designed to be the same size. On the other hand, in the charged particle detector of the present example, by expanding the optical path with the light guide, the area of the divided cell of the scintillator can be made smaller than that of the detection cell of the photodetector, and the resolution of incident position discrimination of the signal electrons can be improved as the area of the divided cell of the scintillator is made smaller. The charged particle detector of the present example has an effect that the resolution of incident position discrimination of the signal electrons can be improved by expanding the optical path with the light guide, and having the area of the divided cell of the scintillator smaller than that of the detection cell of the photodetector.

Fourth Example

Figure 5:
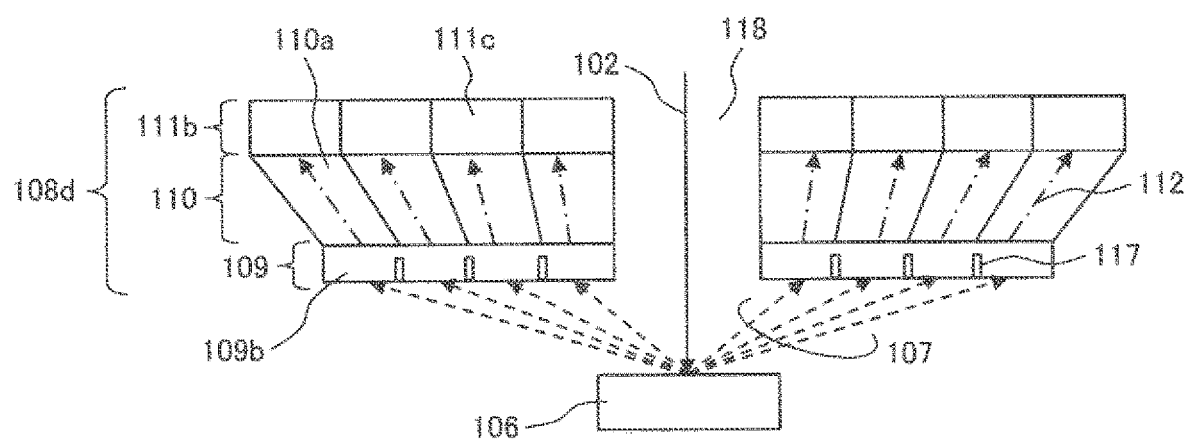
FIG. 5 is a schematic diagram of the charged particle detector according to a fourth example.

FIG. 5 is a schematic diagram of a charged particle detector according to a fourth example. The charged particle detector of the present example also has a structure in which crosstalk is reduced by dividing the scintillator 109 similarly to the second example. In the charged particle detector of the third example, the divided cells of the adjacent scintillators are completely separated, but in the charged particle detector of the present example, the scintillator is divided by providing the groove 117 in the scintillator. As the scintillator is divided by the groove, the crosstalk can be reduced, and the exit angle α of the signal electrons from the specimen can be more accurately calculated from the position of the detection cell of the photodetector when the signal electrons enter.

As the depth of the groove becomes deeper, crosstalk can be prevented, but the risk of the scintillator separating increases. Among the scintillators, there is a scintillator (e.g., a GaN scintillator) in which a light emitting layer is formed on a base material. In the GaN scintillator, a light emitting layer called a multi-quantum well (MQW) layer is formed on a base material such as sapphire. In the case of using a scintillator in which a light emitting layer is formed on such a base material, it is desirable to provide a groove so that the light emitting layer is divided. In addition, since the divided cells 109b of the scintillator are integrated, the light guide and the scintillator can be easily aligned and fixed by forming the grooves so as to coincide with the pitch of the divided blocks of the light guide in advance, and the manufacturing process can be simplified, and the manufacturing cost is reduced.

The charged particle detector according to the present example has an effect that the manufacturing process can be simplified, the manufacturing cost can be reduced, and the accuracy of incident position discrimination of signal electrons can be improved according to a structure of dividing the scintillator with grooves.

In addition, by forming a reflection layer in the groove 117, signal electrons enter a divided cell of a certain scintillator and are converted into photons, and jump out from a side surface of the divided cell to which the signal electrons have entered to enter an adjacent divided cell thus preventing crosstalk from occurring.

A material example of the reflection layer and a method of forming the same are similar to those of the third example. The charged particle detector according to the present example has an effect that crosstalk can be reduced and accuracy of incident position discrimination of signal electrons can be improved by forming the reflection layer in the groove 117 of the scintillator.

Fifth Example

Figure 6:
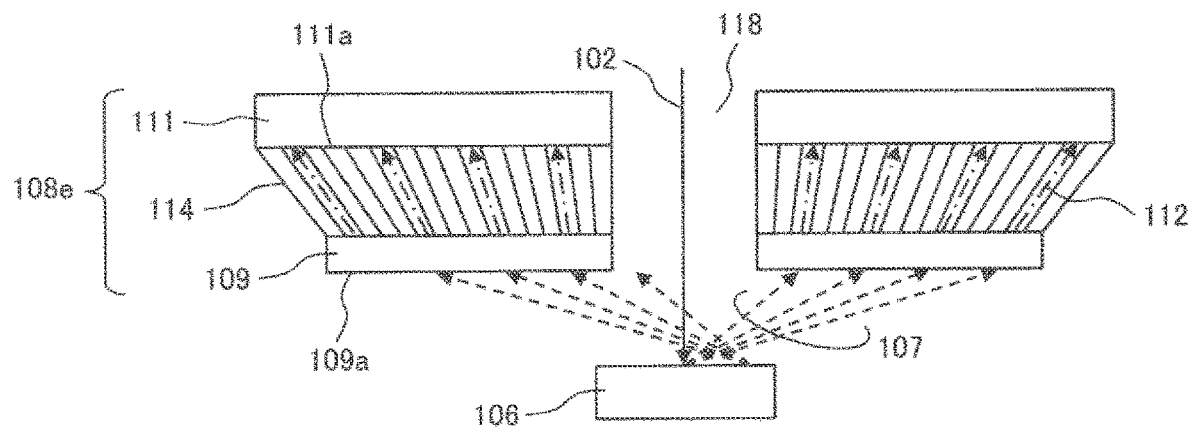
FIG. 6 is a schematic diagram of the charged particle detector according to a fifth example.

FIG. 6 is a schematic diagram of a charged particle detector according to a fifth example. The charged particle detector of the present example uses a tapered fiber optics plate (FOP) 114 as a light guide in addition to the structure of the charged particle detector of the first example. The FOP is an optical component in which fine optical fibers having a diameter of several μm are bundled (e.g., manufactured by Hamamatsu Photonics K.K., model: J5734). Since the photons that have entered the fiber of the incident surface of the FOP exit from the same fiber of the exit surface without invading the adjacent fiber, the photons can be transmitted to the exit surface while holding the incident position of the photons on the incident surface.

In the charged particle detector of the present example, the FOP has a tapered shape, and the area of the exit surface and the fiber diameter are larger than those of the incident surface, but the fact that photons can be transmitted while holding the incident position information of the photons on the incident surface is the same. As described above, there is a bias in the incident position of photons on the scintil-lator, and most of the signal electrons enter a position close to the trajectory of the primary electrons, that is, a position several mm from the opening 118, but the charged particle detector of the present example can guide the photons that have entered with high density to the photodetector while dispersing the photons by fine optical fibers of the tapered FOP, and can prevent the photodetector from being saturated. As described above, the charged particle detector of the present example has a structure in which the optical path is expanded by the tapered FOP, and thus has an effect that the photodetector does not saturate even when the current of the primary electron beam is increased and a photographed image with correct contrast can be obtained.

Furthermore, the transmittance of the tapered FOP (the ratio of the light exiting from the other surface with respect to the light entering from the one surface) becomes higher when the light is propagated from the side having the smaller area to the side having the larger area. Therefore, when the area of the exit surface is increased with respect to the incident surface as in the present configuration, not only is the light dispersed but the transmittance is also increased.

Sixth Example

Figure 7:
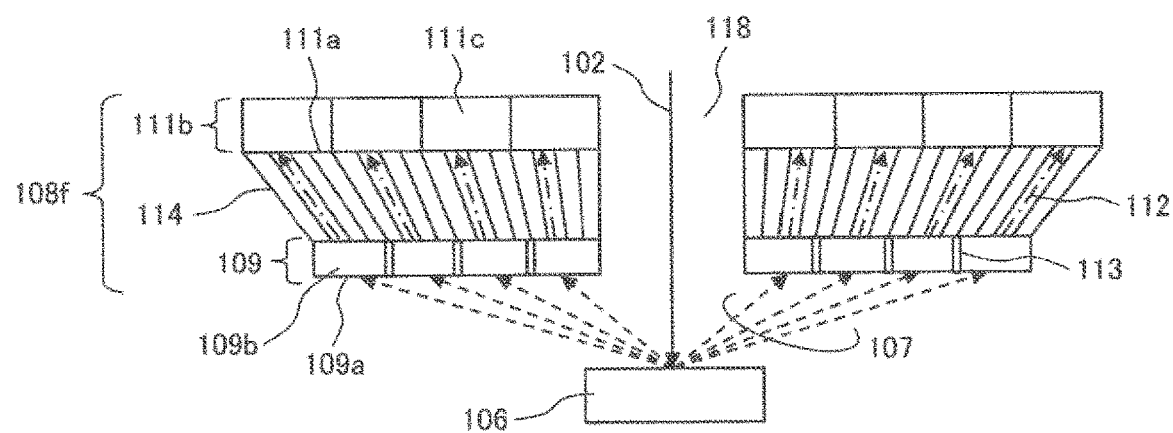
FIG. 7 is a schematic diagram of the charged particle detector according to a sixth example.

FIG. 7 is a schematic diagram of a charged particle detector according to a sixth example. In the charged particle detector of the present example, an array-shaped photodetector and a divided scintillator are used in addition to using the tapered FOP 114 for the light guide similarly to the fourth example. Similar to the charged particle detectors of the third example and the fourth example, the charged particle detector of this example has the divided cells 109b of the scintillator and the detection cells 111c of the photodetector corresponding to each other on a one-to-one basis, and has a function as a position discrimination detector capable of detecting the exit angle of the signal electrons from the specimen.

In the case of using a light guide including a plurality of divided blocks as in the charged particle detectors of the third example and the fourth example, it is necessary to align all of the divided cells of the scintillator, the divided blocks of the light guide, and the detection cells of the photodetector with high accuracy. On the other hand, when the fiber diameter of the tapered FOP is several μm and the fiber diameter of the FOP is sufficiently small compared to the size of the divided cell of the scintillator or the detection cell of the photodetector, the divided cells of the scintillator and the detection cells of the photodetector are respectively aligned with high accuracy, and when the magnification (area ratio between the incident surface and the exit surface) of the tapered FOP is equal to the area ratio between the detection surface 109a of the scintillator and the detection surface 111a of the photodetector, the tapered FOP does not need to be aligned with high accuracy, and the assembly process and structure of the detector can be simplified.

The charged particle detector of the present example has a structure in which the tapered FOP is used for the light guide, so that the light guide does not need to be aligned, the manufacturing process of the detector can be simplified, and the manufacturing cost can be reduced.

Seventh Example

Figure 8:
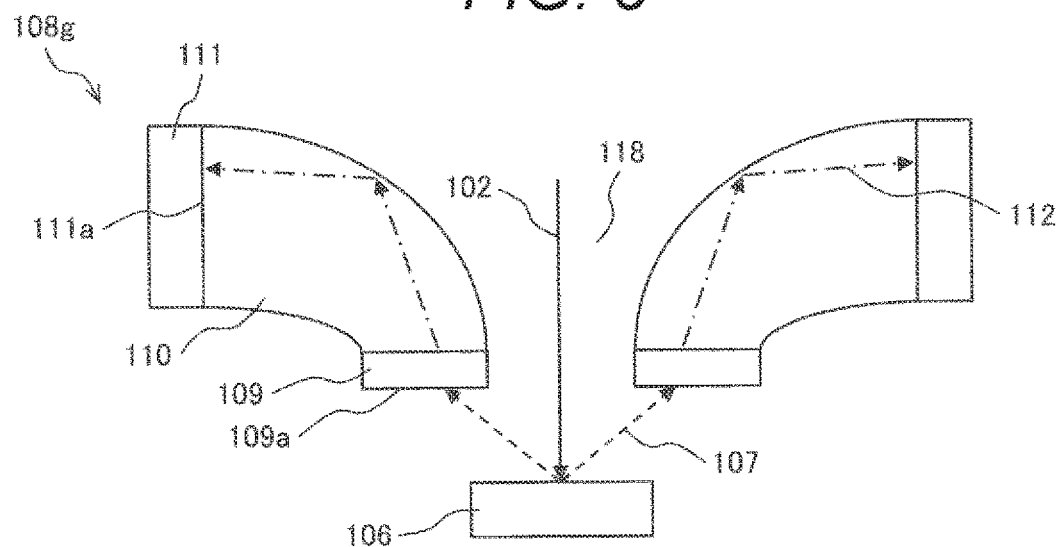
FIG. 8 is a schematic diagram of the charged particle detector according to a seventh example.

FIG. 8 is a schematic diagram of a charged particle detector according to a seventh example. The charged particle detector of the present example has a structure in which the scintillator 109 and the detection surface of the photodetector 111 are arranged at positions (perpendicular in the drawing) that are not parallel to each other and light is guided by the light guide 110 in the configuration of the first example. The charged particle detector needs to be as small as possible so that it can be installed between the specimen and the pole piece of the final lens as described above. The charged particle detector of the present embodiment has an effect that it is not always necessary to arrange the scintillator 109 and the photodetector 111 in parallel by bending the light guide, and the degree of freedom of the shape of the charged particle detector is increased, and an effect that the charged particle detector can be accommodated in a small space between the objective lens and the specimen.

Eighth Example

Figure 9:
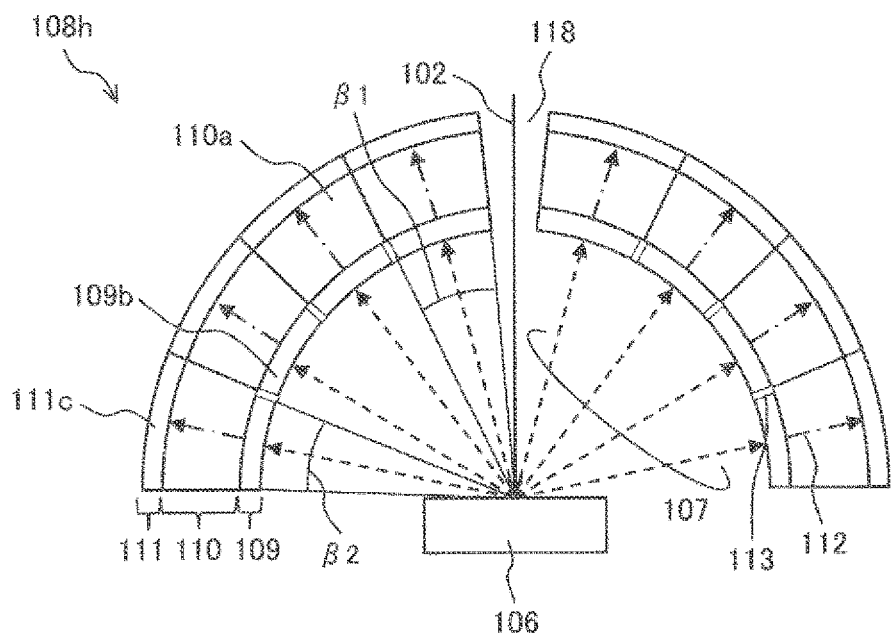
FIG. 9 is a schematic diagram of the charged particle detector according to an eighth example.

FIG. 9 is a schematic diagram of a charged particle detector according to an eighth example. The charged particle detector of the present example is obtained by forming the charged particle detector of the third example in a dome shape. The scintillator 109 is divided by the dividing unit 113, and the area of the detection cell 111c of the photodetector is larger than that of the divided cell 109b of the scintillator.

Figure 10:
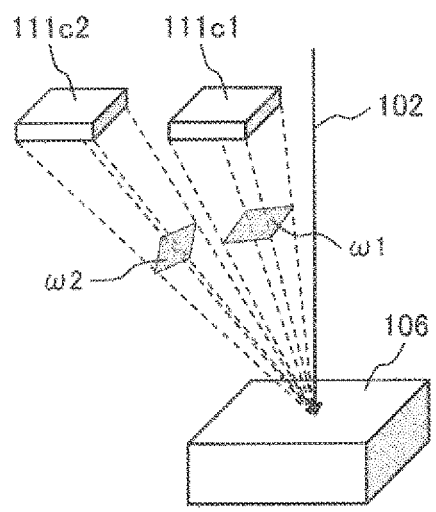
FIG. 10 is a schematic view showing an example of a positional relationship between a divided cell of a scintillator and a specimen.

FIG. 10 is a schematic diagram showing an example of a positional relationship between a divided cell of a scintillator and a specimen. In FIG. 10, the divided cells of the scintillator are arranged parallel to the specimen. When the divided cells of the scintillator are arranged parallel to the specimen as in the second to fifth examples, the positional relationship between the divided cells of the scintillator and the specimen is as shown in FIG. 10. Assume that a solid angle drawn by the signal electron entering the divided cell 111c1 of the scintillator closest to the trajectory of the primary electrons 102 is $\omega 1$, and a solid angle drawn by the signal electron entering the divided cell 111c2 of the farthest scintillator is $\omega 2$. In the arrangement as illustrated in FIG. 10, as the divided cell of the scintillator is farther from the trajectory of the primary electrons 102, the distance from the incident position of the primary electrons on the specimen to the divided cell of the scintillator becomes longer, and the solid angle also becomes smaller. Therefore, $\omega 2$ is smaller than $\omega 1$, and the number of signal electrons entering the divided cell 111c2 of the scintillator farthest from the trajectory of the primary electrons 102 decreases.

Figure 11:
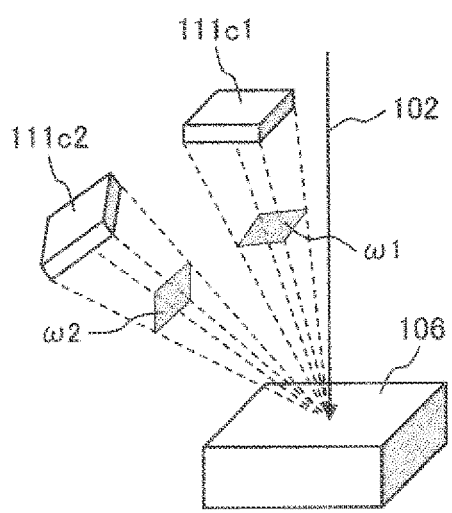
FIG. 11 is a schematic view showing another example of a positional relationship between a divided cell of a scintillator and a specimen.

FIG. 11 is a schematic view showing another example of a positional relationship between a divided cell of a scintillator and a specimen. In FIG. 11, the divided cells of the scintillator are arranged parallel to the specimen. When the scintillator is arranged in a dome shape with respect to the specimen as in the present example, the positional relationship between the divided cells of the scintillator and the specimen is as shown in FIG. 11. In the arrangement as illustrated in FIG. 11, even when the distance from the trajectory of the primary electrons 102 to the divided cell of the scintillator changes, the distance from the incident position of the primary electrons on the specimen to the divided cell of the scintillator becomes equal, and the solid angle also becomes equal. Therefore, $\omega 2$ is equal to $\omega 1$, and the number of signal electrons entering the divided cell 111c2 of the scintillator farthest from the trajectory of the primary electrons 102 increases compared to the case of FIG. 10. The charged particle detector of the present example has a structure in which the divided cells of the scintillator are arranged in a dome shape, and thus has an effect that the number of signal electrons entering the divided cells of the scintillator far from the trajectory of the primary electrons increases.

Ninth Example

Figure 12:
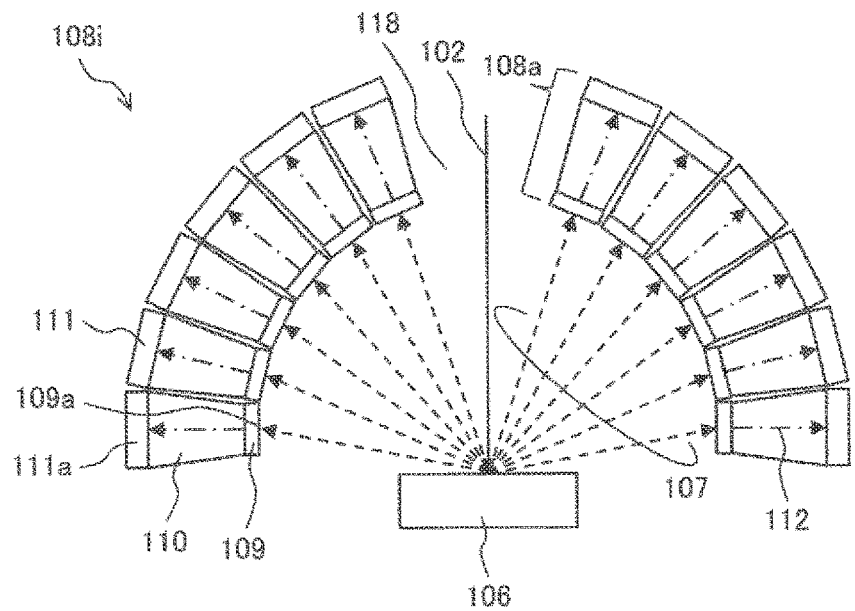
FIG. 12 is a schematic diagram of the charged particle detector according to a ninth example.

FIG. 12 is a schematic diagram of a charged particle detector according to a ninth example. The charged particle detector of the present example includes a scintillator 109, a light guide 110, and a photodetector 111, and a plurality of charged particle detectors 108a in which an area of a detection surface 111a of the photodetector is larger than that of a detection surface 109a of the scintillator are arranged in a dome shape at positions where signal electrons 107 come flying. The charged particle detector of the present example has a function as a position discrimination detector, and since the charged particle detectors 108a are completely independent from each other, there is no crosstalk between the charged particle detectors, and the exit angle of the signal electrons 107 from the specimen can be more accurately detected from the position of the charged particle detector when the signal electrons enter.

In addition, similarly to the eighth example, the distances from the incident positions of the primary electrons on the specimen to the scintillators of the respective charged particle detectors become equal, the solid angles drawn by the signal electrons entering the scintillators of the respective charged particle detectors also become equal, and the number of signal electrons entering the charged particle detector farthest from the trajectory of the primary electrons 102 increases. The charged particle detector of the present example has a structure in which a plurality of charged particle detectors in which an area of the detection surface of the photodetector is larger than that of the detection surface of the scintillator are arranged in a dome shape, and thus has an effect that the accuracy of the incident position discrimination of the signal electrons improves and the number of signal electrons entering the scintillator of the charged particle detector far from the trajectory of the primary electrons increases.

Tenth Example

Figure 13:
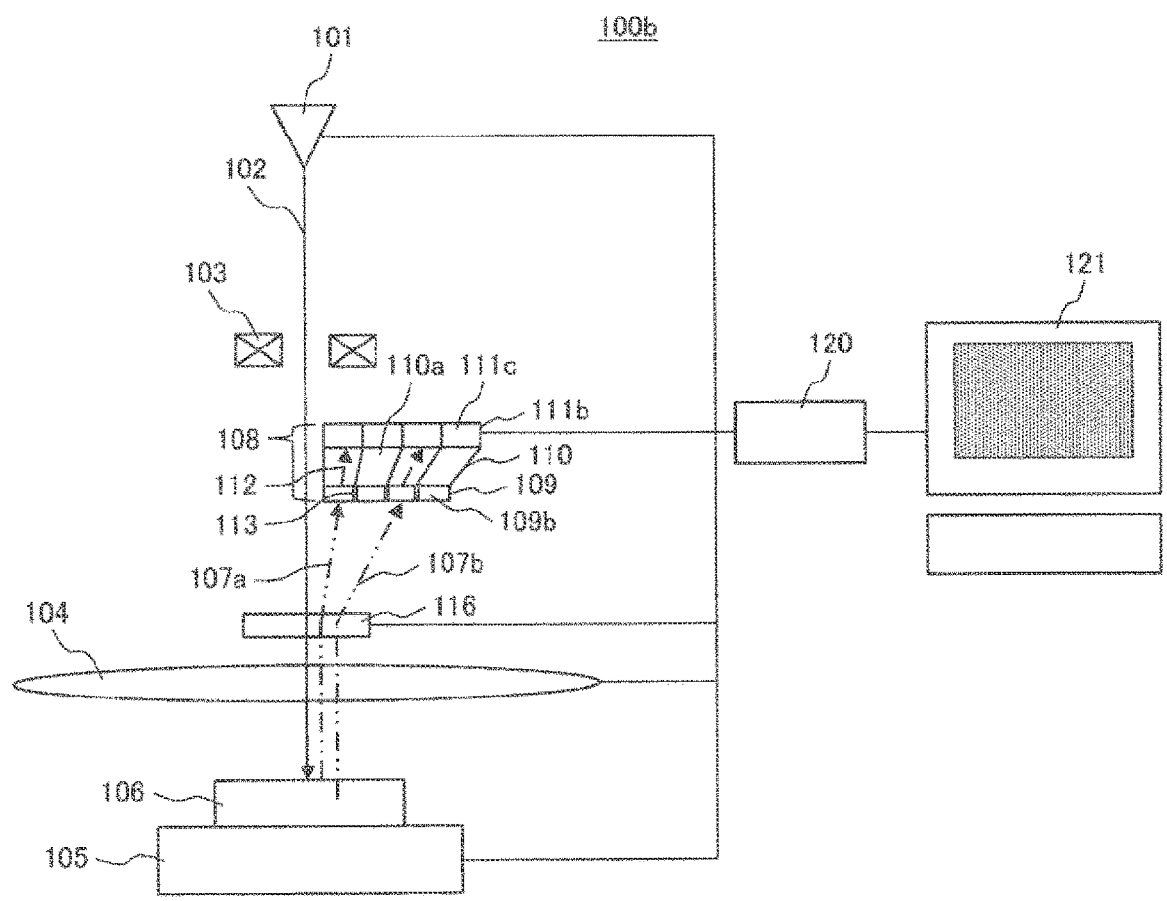
FIG. 13 is a schematic diagram of a charged particle ray device according to a tenth example.

FIG. 13 is a schematic diagram of a charged particle ray device according to a tenth example. A scanning deflector 103 and an objective lens 104 are provided on the trajectory of the primary electrons 102 extracted from the electron source 101. The specimen 106 arranged on the specimen transport stage 105 is irradiated with the primary electrons 102, and signal electrons 107a having a small reflection depth at the specimen and signal electrons 107b having a large reflection depth at the specimen are exited from the specimen 106.

An E×B deflector 116 is arranged on the objective lens 104 to deflect the signal electrons according to the magnitude of energy. The charged particle detector 108 having a function as a position discrimination detector including the divided scintillator 109, the divided light guide 110, the array-shaped photodetector 111b, and the dividing unit 113 is provided in the advancing direction of the deflected reflected electrons, and signal processing of the detected signal electrons is performed in synchronization with a scanning signal sent from a system control unit 1001 to the scanning deflector 103, so that an observation image is formed on a monitor 121.

The E×B deflector 116 is a deflector using the behavior of electrons in an electric field and a magnetic field, and has a function of not deflecting electrons (primary electrons) entering from above but deflecting electrons (signal electrons) entering from below. Among the signal electrons, there are reflected electrons that are exited from the specimen after the primary electrons are reflected in the specimen. Reflected electrons generally refer to electrons having energy of greater than or equal to 50 eV, and the magnitude of the energy varies depending on the reflection depth in the specimen. The energy of the reflected electrons decreases as the reflection depth in the specimen increases, and increases as the reflection depth decreases. The angle deflected by the E×B deflector varies depending on the magnitude of the energy of the electrons, and the signal electrons 107a having a small reflection depth at the specimen have a large energy and are deflected at a small angle, and the signal electrons 107b having a large reflection depth at the specimen have a small energy and are deflected at a large angle.

Similarly to the position discrimination detector (e.g., third, fourth, sixth, and eighth examples), the charged particle detector 108 of the charged particle ray device of the present example can discriminate signal electrons from the position of the detection cell of the photodetector corresponding to the incident position of the signal electrons on the detection surface of the scintillator. In addition, the position discrimination detector can calculate the exit angle of the signal electrons from the specimen from the position of the detection cell of the photodetector when the signal electrons enter, but the charged particle detector of the charged particle device of the present example can similarly calculate the deflection angle of the signal electrons by the E×B deflector 116 from the position of the detection cell of the photodetector. Since the deflection angle by the E×B deflector 116 depends on the magnitude of the energy of the signal electrons, that is, the reflection depth, the reflection depth of the signal electrons can be calculated from the deflection angle by the E×B deflector 116.

As a result, the charged particle detector of the charged particle device of the present example can detect the signal electrons for each reflection depth from the position of the detection cell of the photodetector when the signal electrons enter, and can calculate the reflection depth. Furthermore, by forming an observation image using only the signal electrons having the same reflection depth, an observation image at a certain depth of the specimen can be acquired, and a three-dimensional observation image of the specimen can be acquired by acquiring the observation images at the respective depths and stacking the observation images in descending order of the reflection depth. The charged particle device of the present example has a structure in which the E×B deflector is arranged on the objective lens and the position discrimination detector is arranged in the advancing direction of the signal electrons deflected by the E×B deflector, and thus has an effect that the reflection depth of the signal electrons can be calculated, an observation image at a certain depth of the specimen can be acquired, and a three-dimensional observation image of the specimen can be acquired.

Eleventh Example

Figure 14:
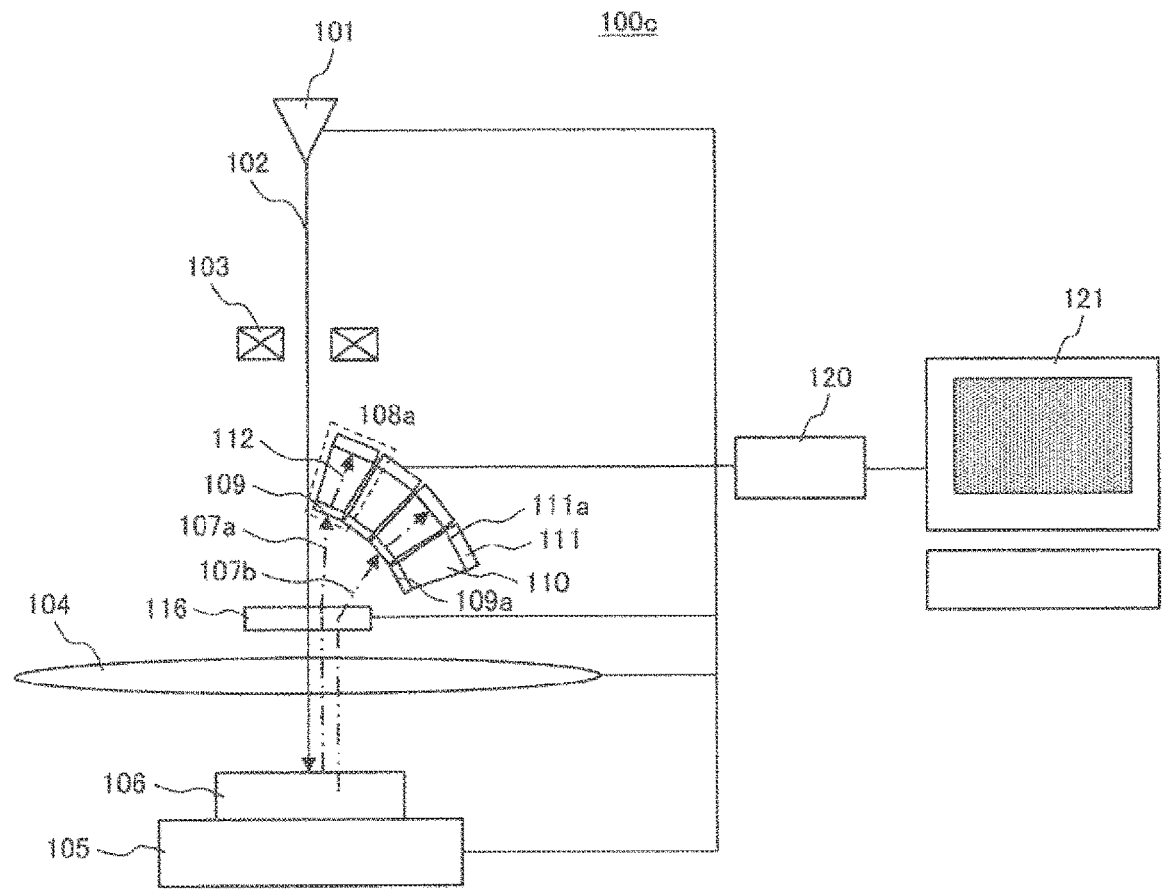
FIG. 14 is a schematic diagram of a charged particle device according to an eleventh example.

FIG. 14 is a schematic diagram of a charged particle device according to an eleventh example. The charged particle ray device of the present example has a structure similar to that of the charged particle device of the tenth example, but is different in that a plurality of charged particle detectors 108a in which an area of the detection surface 111a of the photodetector is larger than that of the detection surface 109a of the scintillator are arranged in a dome shape in the advancing direction of the signal electrons deflected by the E×B deflector 116. With this structure, similarly to the charged particle device of the seventh example, the charged particle device of the present example can calculate the reflection depth of the signal electron from the position of the detection cell of the photodetector when the signal electrons enter, can acquire the observation image at a certain depth of the specimen, and can acquire the three-dimensional observation image of the specimen.

Furthermore, by arranging the charged particle detectors 108a in a dome shape, even if the distance from the trajectory of the primary electrons 102 to the charged particle detector 108a changes, the distance from the deflection position of the signal electrons of the E×B deflector 116 to the scintillator 109 of the charged particle detector 108a becomes equal, and the number of signal electrons entering the scintillator 109 of the charged particle detector 108a farthest from the trajectory of the primary electrons 102 increases. The charged particle detector of the present example has a structure in which the charged particle detectors are arranged in a dome shape, and thus has an effect that the number of signal electrons entering the scintillator of the charged particle detector far from the trajectory of the primary electrons increases.

In addition, since the charged particle detectors 108a of the charged particle device of the present example are completely independent from each other, there is no crosstalk between the charged particle detectors, the deflection angle by the E×B deflector 116 can be calculated more accurately, and the detection accuracy of the reflection depth of the signal electrons can be improved. The charged particle device of the present example has a structure in which a plurality of charged particle detectors in which an area of the detection surface of the photodetector is larger than that of the detection surface of the scintillator are arranged in a dome shape in the advancing direction of the signal electrons deflected by the E×B deflector, and thus has an effect that the detection accuracy of the reflection depth of the signal electrons improve.

Twelfth Example

Figure 15:
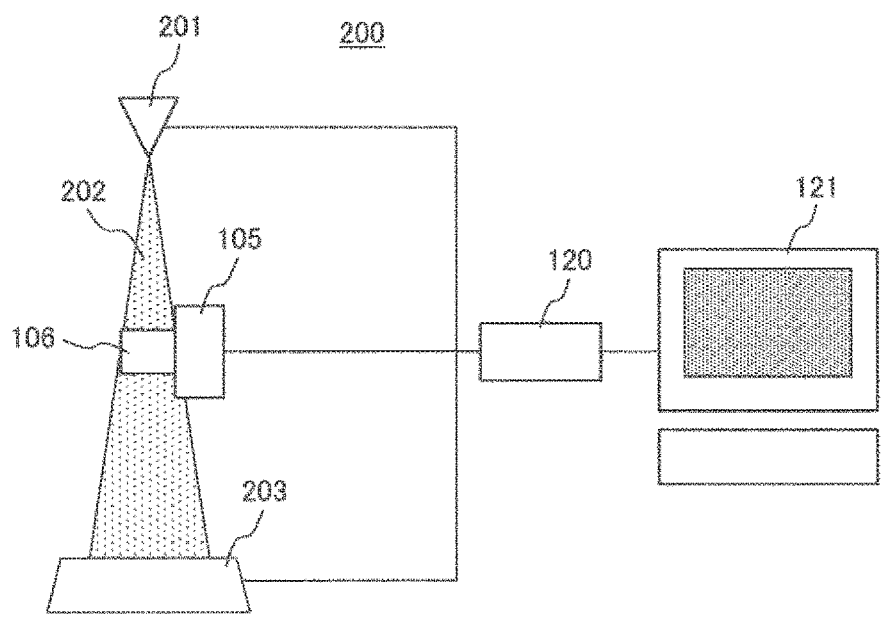
FIG. 15 is a schematic diagram of an example of a radiation detection device of a twelfth example.

In the first to twelfth examples, the charged particle ray detector and the charged particle ray device have been described, but the configuration of the charged particle detector of the present invention can also be applied to a radiation detector. FIG. 15 is a schematic diagram of an example of a radiation detection device of the twelfth example, and FIG. 16 is a diagram illustrating the radiation detector of FIG. 15.

As illustrated in FIG. 15, a radiation detection device 200 includes an X-ray source 201 that irradiates the specimen 106 on the specimen transport stage 105 with X-rays (radiation), and an X-ray detector 203 that detects the X-rays transmitted through the specimen 106.

Figure 16:
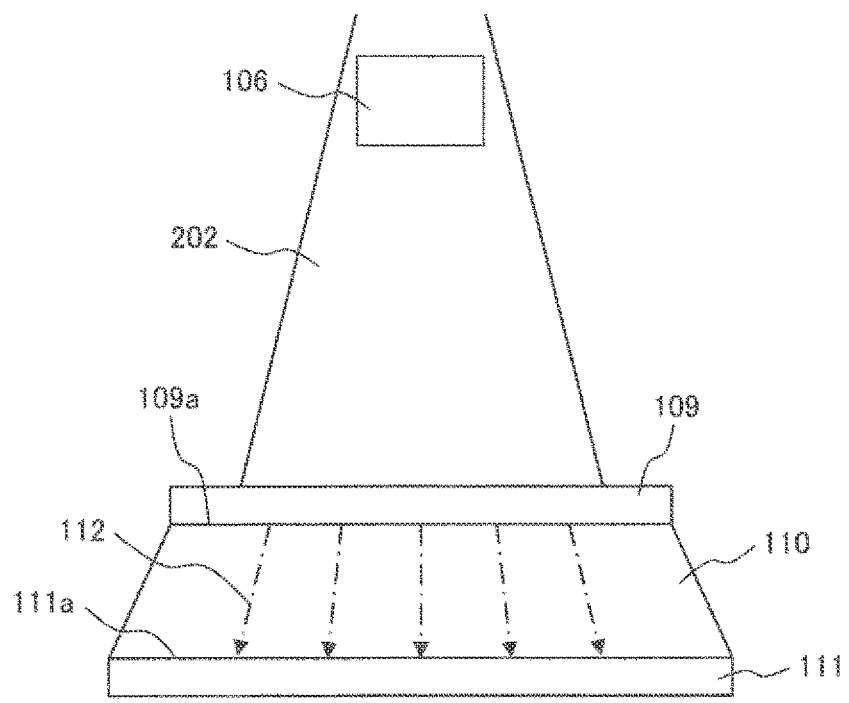
FIG. 16 is a diagram showing the radiation detector of FIG. 15.

As illustrated in FIG. 16, the radiation detector includes a scintillator having a radiation detection surface for detecting radiation and converting the detected radiation into light, a photodetector having a light detection surface for detecting light emitted from the scintillator, and a light guide provided between the scintillator and the photodetector, and has a configuration in which an area of the light detection surface is larger than an area of the radiation detection surface. With such a configuration, similarly to the charged particle detectors of the first to eleventh examples described above, a radiation detector and a radiation detection device capable of obtaining an observation image with correct contrast without saturating even when the intensity of radiation entering the detector is increased can be obtained.

As described above, according to the present invention, it has been shown that the current of the primary electron beam can be increased.

The above-described examples have been described in detail for the sake of easy understanding of the present invention, and are not necessarily limited to those having all the described configurations. Furthermore, a part of the configuration of a certain example can be replaced with the configuration of another example, and the configuration of a certain example can be added with the configuration of another example. In addition, it is possible to add, delete, and replace other configurations for a part of the configuration of each example.

REFERENCE SIGNS LIST 100a, 100b, 100c charged particle ray device
101 electron source
102 primary electron
103 scanning deflector
104 objective lens
105 specimen transport stage
106 specimen
107 signal electron
107a signal electron having small reflection depth
107b signal electron having large reflection depth
108a, 108b, 108c, 108d, 108e, 108f, 108g, 108h, 108i charged particle detector
108a charged particle detector
109 scintillator
109a detection surface of scintillator
109b divided cell of scintillator
109c side surface of divided cell of scintillator
110 light guide
110a divided block of light guide
111 photodetector
111a detection surface of photodetector
111b array-shaped photodetector
111c detection cell of photodetector
112 light
113 dividing unit
113a partition frame
113b partition
114 tapered FOP
115 adhesive
116 ExB deflector
117 groove
118 opening
120 system control unit
121 monitor
130 charged particle detector
w distance from incident position of primary electron on specimen to incident position of signal electron on detection surface of scintillator
h distance from surface of specimen to detection surface of scintillator
α exit angle of signal electron from specimen
ω1 solid angle drawn by signal electron entering divided cell of scintillator closest to trajectory of primary electron
ω2 solid angle drawn by signal electron entering divided cell of scintillator farthest from trajectory of primary electron
200 radiation detection device
201 X-ray source
202 X-ray
203 X-ray detector

The invention claimed is:

1. A charged particle detector comprising:
a scintillator having a signal electron detection surface for detecting signal electrons that exit from a specimen when the specimen is irradiated with primary electrons, and converting the signal electrons into light;
a photodetector having a light detection surface for detecting light emitted from the scintillator; and
a light guide serving as an optical path of the light, the light guide being provided between the scintillator and the photodetector,
wherein an area of the light detection surface is larger than an area of the signal electron detection surface,
wherein the light guide and the photodetector are divided into a plurality of cells, and
wherein, in each of the divided cells of the light guide, the optical path is expanded from an incident surface of the light provided at an end portion on the scintillator side toward an exit surface of the light provided at an end portion on the photodetector side.

2. The charged particle detector according to claim 1, wherein the light guide and the photodetector are divided into a plurality of cells by a dividing unit.

3. The charged particle detector according to claim 1, wherein the scintillator is divided into a plurality of cells.

4. The charged particle detector according to claim 3, wherein the scintillator is divided into a plurality of cells by the dividing unit.

5. The charged particle detector according to claim 2, wherein a reflection layer that reflects light is provided on a surface of the dividing unit.

6. The charged particle detector according to claim 3, wherein the scintillator includes a plurality of grooves provided toward the photodetector.

7. The charged particle detector according to claim 6, wherein a reflection layer that reflects light is provided on a surface of the groove.

8. The charged particle detector according to claim 5, wherein a material of the reflection layer is aluminum.

9. The charged particle detector according to claim 1, wherein the light guide includes a plurality of fiber optic plates.

10. The charged particle detector according to claim 1, wherein an area ratio between an incident surface connected to the scintillator of the light guide and an exit surface connected to the light detection surface is equal to an area ratio between the signal electron detection surface and the light detection surface.

11. The charged particle detector according to claim 1, wherein an area ratio between the signal electron detection surface and the light detection surface is 1:20 or less.

12. The charged particle detector according to claim 1, wherein cross-sectional shapes of the scintillator, the photodetector, and the light guide are fan shapes.

13. The charged particle detector according to claim 1, wherein the photodetector is arranged perpendicular to the scintillator.

14. A charged particle ray device comprising:
the charged particle detector according to claim 1;
a control unit that controls scanning of the primary electrons; and
a display unit that processes the signal electrons and displays an image of the specimen.

15. A radiation detector comprising:
a scintillator having a radiation detection surface for detecting radiation and converting a radiation signal into light;
a photodetector having a light detection surface for detecting light emitted from the scintillator; and
a light guide serving as an optical path of the light, the light guide being provided between the scintillator and the photodetector,
wherein an area of the light detection surface is larger than an area of the radiation detection surface,
wherein the light guide and the photodetector are divided into a plurality of cells, and
wherein, in each of the divided cells of the light guide, the optical path is expanded from an incident surface of the light provided at an end portion on the scintillator side toward an exit surface of the light provided at an end portion on the photodetector side.

16. A radiation device comprising:
the radiation detector according to claim 15;
a radiation source that irradiates a specimen with radiation; and
a display unit that processes a signal obtained from the radiation detector and displays an image of the specimen.

* * * * *